United States Patent

Hayai

[11] Patent Number: 5,837,355
[45] Date of Patent: Nov. 17, 1998

[54] MULTILAYER PRINTED CIRCUIT BOARD AND PROCESS FOR PRODUCING AND USING THE SAME

[75] Inventor: Hiroshi Hayai, Fujieda, Japan

[73] Assignee: Sumitomo Bakelite Company Limited, Tokyo, Japan

[21] Appl. No.: 745,217

[22] Filed: Nov. 7, 1996

[51] Int. Cl.$^6$ ................................................. B32B 3/00
[52] U.S. Cl. .................. 428/209; 428/320.2; 428/321.5; 428/323; 428/413; 428/425.8; 428/901; 428/344; 156/307.3
[58] Field of Search ............... 428/209, 901, 428/320.2, 321.5, 323, 413, 425.8, 344; 442/175, 178, 179, 180; 156/307.3

[56] References Cited

U.S. PATENT DOCUMENTS

| | | | |
|---|---|---|---|
| 3,558,423 | 1/1971 | Rossetti, Jr. | 428/901 |
| 3,660,199 | 5/1972 | Riccitiello et al. | 428/901 |
| 4,020,225 | 4/1977 | Fujiwara et al. | 428/901 |
| 4,579,772 | 4/1986 | Bhatt et al. | 442/175 |
| 4,623,578 | 11/1986 | Marchetti et al. | 428/901 |
| 4,714,648 | 12/1987 | Nagata | 442/175 |
| 4,751,146 | 6/1988 | Maeda et al. | 428/209 |
| 4,798,762 | 1/1989 | Okada et al. | 428/901 |
| 4,975,319 | 12/1990 | Walles et al. | 428/901 |
| 4,994,133 | 2/1991 | Oizumi et al. | 429/901 |
| 5,273,816 | 12/1993 | Olson et al. | 428/901 |
| 5,368,921 | 11/1994 | Ishii et al. | 428/901 |
| 5,599,612 | 2/1997 | Muraki et al. | 442/175 |
| 5,644,003 | 7/1997 | Arai et al. | 428/901 |
| 5,670,250 | 9/1997 | Sanville, Jr. et al. | 428/901 |
| 5,677,045 | 10/1997 | Nagai et al. | 428/901 |

FOREIGN PATENT DOCUMENTS

| | | |
|---|---|---|
| 7-297552 | 11/1995 | Japan . |

*Primary Examiner*—Cathy F. Lam
*Attorney, Agent, or Firm*—Browdy and Neimark

[57] ABSTRACT

A process for producing a multilayer printed circuit board, comprising the steps of: impregnating a thermosetting resin in a base material to form a prepreg, applying a thermosetting epoxy resin undercoating agent comprising dicyandiamide and a micro-capsulated imidazole compound to at least one side of an interlayer circuit board on at least one side of which circuit has been formed, heating the applied undercoating agent to dry or semi-cure the undercoating agent, and laying the prepreg on at least one side of the dried or semi-cured undercoating agent-applied interlayer circuit board and subjecting them to laminating press.

11 Claims, No Drawings

MULTILAYER PRINTED CIRCUIT BOARD AND PROCESS FOR PRODUCING AND USING THE SAME

FIELD OF THE INVENTION

The present invention relates to a process for producing a multilayer printed circuit board in which a manhour or production time required for the production are reduced.

BACKGROUND OF THE INVENTION

Multilayer printed circuit boards have generally been manufactured by a process comprising the steps of directly laying on an interlayer circuit board (a copper-clad laminate in which circuit has been formed and which is used as interlayer circuit board), one or more sheets of prepreg obtained by impregnating a thermosetting resin in a base material, further laying a metal foil on the outer side thereof, and subjecting the assembly to pressing molding with a hot plate. Such conventional process has required a long period of time for the pressing molding.

In such a conventional technique, it has been difficult to sufficiently remove air cells present in recessions of circuits of the interlayer circuit board at the time of the molding for a multilayer printed circuit board because the circuits had been formed in the surface of the interlayer circuit board. In order to remove the air cells, it has been required to increase a period of time for melting of the resin in the prepreg and mold under a reduced pressure with a vacuum press.

Further, the thickness of the multilayer printed circuit board produced is not dependent on the copper foil retention ratio on the interlayer circuit board. In order to control the thickness precision, it has been required to be ready for many types of prepregs in which the resin content, period of time for melting and the like are different from each other. Therefore, this has resulted in an increase in man-hours required for the production steps and quality control of the multilayer printed circuit board, which results in an increase in cost.

The present invention relates to a process for producing a multilayer printed circuit board, comprising the step of beforehand applying a thermosetting epoxy resin undercoating agent to an interlayer circuit board and drying or semi-curing. Therefore, since air cells, which are present in recessions of the circuits of the interlayer circuit board and are directly contact with a base surface or a copper foil of the circuit, are almost dispersed in the undercoating agent, the air cells can be removed by a heating under pressure at the time of molding and no voids are left whereby good products (multilayer printed circuit board) are obtained even though conventional press molding for a long period of time with a vacuum press is not carried out.

Further, since it comes to be possible to shorten the curing time of the thermosetting resin in the prepreg and the epoxy resin undercoating agent from the view point of multilayer laminate step, the multilayer printed circuit board production time can be remarkably shortened.

Furthermore, since the undercoating agent is beforehand applied to the interlayer circuit board in the present invention, the thickness precision of the multilayer printed circuit board can be controlled without being dependent on the copper foil retention ratio which results in a reduction of a kind of the prepreg used. As a result, the prepreg types can be reduced with the production of fewer types in larger amounts, which results in remarkable reduction of production costs as well as man-hours required for the control of quality and stocking of the prepreg.

SUMMARY OF THE INVENTION

The present invention provides a process for producing a multilayer printed circuit board, comprising the steps of:

impregnating a thermosetting resin into a base material to form a prepreg, applying a thermosetting epoxy resin undercoating agent comprising dicyandiamide and a micro-capsulated imidazole compound to at least one side of an interlayer circuit board on at least one side of which a circuit has been formed, heating the applied undercoating agent to dry or semi-cure the undercoating agent, and laying the prepreg on at least one side of the dried or semi-cured undercoating agent-applied interlayer circuit board and subjecting them to laminating under-pressure.

The present invention also provides a multilayer printed circuit board comprising an interlayer circuit board and a prepreg, wherein the prepreg is obtained by impregnating a thermosetting resin into a base material, and the multilayer printed circuit board is obtained by applying a thermosetting epoxy resin undercoating agent comprising dicyandiamide and a micro-capsulated imidazole compound to at least one side of an interlayer circuit board on at least one side of which a circuit has been formed, heating the applied undercoating agent to dry or semi-cure the undercoating agent, laying the prepreg on at least one side of the dried or semi-cured undercoating agent-applied interlayer circuit board and subjecting them to laminating under-pressure.

The present invention further provides a process for using a multilayer printed circuit board, comprising the step of applying the aforesaid multilayer printed circuit board to cameras, facsimiles, duplicating machines, word processors or computers.

DETAILED DESCRIPTION OF THE INVENTION

A detailed description of the present invention follows.

As the prepreg, in which a thermosetting resin is impregnated, used in the present invention, a quick-curing thermosetting resin as compared with conventional resins can be also used for attaining the purpose of the present invention. In order to obtain the quick-curing prepreg, it is required to improve a curing property by, for example, properly selecting a kind or amount of a curing agent or a curing accelerator in the thermosetting resin used.

The prepreg in the present invention is obtained by impregnating a thermosetting resin into a base material and preferably drying the same in the following manner. A typical example of the thermosetting resins usable here is an epoxy resin.

It is possible to use the conventional epoxy resins having two or more epoxy groups in the molecule, as epoxy resin, which have been generally employed for the purpose of electrical insulation. Examples of such epoxy resins include bisphenol A type epoxy resins, bisphenol F type epoxy resins, bisphenol S type epoxy resins, phenolic novolak type epoxy resins, orthocresol novolak type epoxy resins, isocyanurate type epoxy resins, and trifunctional or tetrafunctional glycidylamine type epoxy resins. Bromides of these resins are also usable. These resins may be used either singly or as a mixture. The epoxy resin used for the purpose usually contains a typical curing agent and a curing accelerator which are usually used.

The curing agent includes an aromatic polyamine, for example, 4,4'-diaminodiphenylmethane, 4,4'- diaminodiphenylsulfone, 4,4'-diaminodiphenyl-sulfide, bis{4-(4-aminophenoxy)phenyl}sulfone, 4,4'-diaminodiphenylether and 1-orthotoluoylbiguanide; dicyandiamide; and polyhydric phenol such as phenol novolak and ortho-cresolnovolak. These curing agents may be used either singly or as a mixture.

The curing accelerator includes an organic acid hydrazide, imidazole compounds, and a tertiary amine such as dimethylbenzylamine and 1,8-diazabicyclo(5.4.0) undecane.

Impregnation of the base material with the thermosetting resin may be carried out after forming a solution of the thermosetting resin by dissolving the thermosetting resin in a solvent. As the solvent, there can be used, for instance, acetone, methyl ethyl ketone, methyl cellosolve, dimethylformamide and the like. A resin content of the thermosetting resin solution is not specified, but it is preferably in the range of from 30 to 60% by weight. The impregnation temperature may, for instance, be in the range of from 0° C. to 40° C., but it is not specifically defined as far as it allows sufficient impregnation of the thermosetting resin into the base material. Then, the base material impregnated with the thermosetting resin is preferably dried by heating. The drying temperature is also not specified, but it is preferably in the range of from 100° C. to 210° C., more preferably from 150° C. to 180° C.

The base material used for the preparation of the prepreg may in this invention is not specified though glass cloth may be cited as a preferred example. The thickness of the base material is not defined, but it is preferably in the range of from 30 to 300 $\mu$m, more preferably from 50 to 210 $\mu$m. The resin content in the prepreg after impregnation and drying is also not specified, but it is preferably in the range of from 30 to 70% by weight, more preferably from 45 to 55% by weight.

A process for producing an interlayer circuit board used in the present invention is described below. As the method for producing a copper clad laminate having yet no circuit therein, there may, for example, be employed a method in which one sheet or plural sheets of the prepreg produced in the manner described above and a copper foil are placed each other and laminated and press under conditions of 40–80 kg/cm$^2$ and 150°–180° C. for a period of about 60 minutes or more, but the pressure, temperature, time and step for this laminating press are not limited to said conditions. The thickness of the copper foil is not specified, but it is preferably in the range of from 9 to 105 $\mu$m, more preferably from 35 to 70 $\mu$m. The thickness of the copper-clad laminate is not specified, but it is preferably in the range of from 30 to 2,000 $\mu$m, more preferably from 100 to 1,600 $\mu$m. Various methods may be employed for forming circuit in the copper-clad laminate. For instance, an etching resist is applied in the form of the circuit pattern in the copper-clad laminate by screen printing, and then etching is carried out, followed by removal of the resist.

The thermosetting epoxy resin undercoating agent to be applied to at least one side of an interlayer circuit board and dried or semi-cured in the present invention, comprises as essential components dicyandiamide and a micro-capsulated imidazole compound, and further contains preferably an ultrafine particulate silica or a plate filler for providing thixotropic properties. The use of dicyandiamide and the micro-capsulated imidazole compound results in good adhesion of the prepreg to the circuit surface and the base surface of the interlayer circuit board, a reduction of a curing time of the epoxy resin, and a good shelf life. The thermosetting epoxy resin preferably contains mainly a resin having an epoxy equivalent of from 150 to 5,000, and may contain a liquid epoxy resin. The thermosetting epoxy resin is not specifically defined, but includes, for example, bisphenol A type epoxy resins. The imidazole compound is not specifically defined, but includes, for example, imidazole and imidazole derivatives such as 2-methylimidazole, 2-phenylimidazole, 2-phenyl-4-methylimidazole and 2-ethyl-4-methylimidazole.

A process for preparing the micro-capsulated imidazole compound used in the present invention is for example described below, but it is not specifically defined. In case the imidazole compound per se is liquid, the micro-capsulated imidazole compound may be prepared, for example, by dissolving the imidazole compound and a liquid epoxy resin having a low epoxy equivalent (preferably about from 100 to 500) and low molecular weight in a solvent such as methylethylketone with heating, removing the solvent to form a solid compound, pulverizing the solid compound to form a powdered imidazole compound having an average particle size of preferably from 1 to 10 $\mu$m, dispersing the powdered imidazole compound formed and a small amount of tolylenediisocyanate in a solvent such as cyclohexane with stirring, and drying the solution to separate from the solution a micro-capsulated imidazole compound on the surface of which a polyisocyanate layer is coated (for example, 0.1 to 1.0% by weight of the polyisocyanate layer based on the amount of the powder imidazole compound). In case the imidazole compound per se is solid, the micro-capsulated imidazole compound may be prepared, for example, by mixing a beforehand finely pulverized imidazole compound, a polymerizable monomer such as methacrylic acid and acrylonitrile, and a solvent such as toluene and hexane in the presence of a polymerization initiator, stirring the mixture to disperse the components, and heating the dispersed mixture to form a micro-capsulated imidazole compound on the surface of which a polymethacrylic acid/acrylonitrile resin is coated (for example, 0.1 to 10% by weight of the polymethacrylic acid/acrylonitrile resin based on the amount of the pulverized imidazole compound).

The undercoating agent may comprise dicyandiamide, the micro-capsulated imidazole compound, and the thermosetting epoxy resin, for example, in a weight ratio of 1–10:1–10:100, but the weight ratio is not specifically defined.

The thermosetting epoxy resin undercoating agent incorporating such components is applied to at least one side of an interlayer circuit board, and then heated to evaporate the solvent, and thereby is dry-solidified (in a tack-free state) or semi-cured (in B stage). In case of solvent-free type of undercoating agent composition using a liquid epoxy resin as the thermosetting epoxy resin, the epoxy resin is semi-cured (in B stage) with heating.

The purposes of incorporating an ultrafine particulate silica are to avoid applying the undercoating agent in an undesired and uneven thickness caused by the fluidizing of the undercoating agent during the application of the undercoating agent through heat-drying, and to improve a tack-free property, by imparting a thixotropic property to the undercoating agent. In order to impart a thixotropic property to the undercoating agent, it is also effective to incorporate a flake or plate filler such as mica, talc, plate calcium carbonate and plate aluminum hydroxide. Since a plate filler have various types having different properties such as heat resistance and impact resistance, the kind, particle size, compounding ratio and the like of the plate filler are selected for further desirably attaining the purpose of the present invention. The compounding ratio of the ultrafine silica and the plate filler depends upon an application process or drying conditions of the undercoating agent, but falls within the range of preferably from 1 to 20 parts by weight based on 100 parts by weight of the epoxy resin for attaining the purposes. Further, a larger compounding ratio can result in the improvement of flame resistance and softening point, a low expansion coefficient, and a decrease in cost.

The ultrafine silica includes that having an average particle size of 50 nm or less, preferably from 1 nm to 40 nm. The shape of the ultrafine silica includes, for example, spherical, spherical-like, ellipse, and undefined, but is not specifically defined. The plate filler includes, for example, that having a diameter of about from 1 $\mu$m to 50 $\mu$m and the ratio of a thickness to a diameter of 0.5:1 or less, preferably from 0.05:1 to 0.5:1, but the diameter and the ratio are not specifically defined.

The application and heat-drying of the undercoating agent may be subjected to only one side of the interlayer circuit board, but preferably to both sides. In case of applying to both sides, the application and heat-drying may be subjected to each side sequentially or simultaneously to both sides. Then, the undercoating agent is dried (a tack-free state) or semi-cured (in B stage) by heat. Therefore, a prepreg, preferably a quick-curing prepreg, and copper foil are laid on at least one side of the undercoating agent-applied interlayer circuit board, and a multilayer printed circuit board is obtained by laminating with a heating and pressing.

Such undercoating agent may be applied in the conventional coating methods such as roll coating, curtain coating, casting, spin coating, dip coater and screen printing. Any other method can be employed as far as it is capable of uniform coating of the surface of the interlayer circuit board.

The undercoat thickness is variable depending on the coating method, the copper foil thickness of the interlayer circuit board, etc. For instance, the thickness may be 10–50 $\mu$m, but this of course is not definitive.

The heating of the undercoating agent is conducted, for example, under the conditions of a temperature of preferably from 90° to 190° C., more preferably from 120° to 150° C., and a period of time of preferably from 1 to 60 minutes, more preferably from 5 to 15 minutes, but the conditions are not specifically limited to said conditions as far as the undercoating agent coated on the interlayer circuit board is dry-solidified or semi-cured (to B stage) by the evaporating of a solvent, or semi-cured in case of a solvent-free type. "B stage", which signifies a semi-cured state, indicates an advanced state of curing but a still thermoplastic state, that is, a state which is not advanced to a gel state.

According to the present invention, the prepreg obtained in the manner described above is laid (placed) on at least one side of the interlayer circuit board, to which the undercoating agent is applied and heated to dry or semi-cure, and subjected to laminating in the following way. The prepreg may be placed on either one side or both sides of the interlayer circuit board. Plural sheets of the prepreg may be so placed. Laminating may be carried out, for example, under the conditions of 40–80 kg/cm$^2$ and 150°–180° C. for a period of about 60 minutes or more, but the pressure, temperature and time for this laminating press are not limited to said conditions.

In the present invention, recessions of the circuit patterns are beforehand filled with the thermosetting epoxy resin undercoating agent by applying the undercoating agent to the interlayer circuit board. Therefore, even if a prepreg, preferably a quick-curing prepreg, is laid and press molded against the interlayer circuit board, most of air cells are not directly in contact with a base or a copper foil of the interlayer circuit board and the remaining air cells are almost entirely removed at the time of the molding, thereby forming a multilayer printed circuit board in which air cells are not left. Further, since the thickness precision of the multilayer printed circuit board is not dependent upon the copper foil retention ratio in the interlayer circuit board, few kinds of prepreg can be sufficient, which results in the prepreg production in large amounts and of few kinds, reduction of production cost, and a remarkable reduction of man-hours required for the control of quality and stocking the prepreg.

The present invention is further illustrated by the following examples. The examples are not to be construed in anyway as limited the scope of this invention.

EXAMPLE

Example 1

Into a solution of 80 parts by weight of ethyldiglycol, 10 parts by weight of butylcellosolve acetate and 10 parts by weight of diacetone alcohol, 100 parts by weight of bisphenol A type epoxy resin (epoxy equivalent: 190) was dissolved and 8 parts by weight of fine powder dicyandiamide, 2 parts by weight of a micro-capsulated 2-methylimidazole, and 10 parts by weight ultrafine particulate silica (average particle size of 16 nm, R-972 commercially available from Nippon Aerosil CO., LTD.) were added. The mixture was kneaded by a three-roll mill to form a thermosetting epoxy resin undercoating agent.

Next, circuit was formed on a both side-copper-clad glasscloth reinforced epoxy resin-laminate having a substrate thickness of 0.1 mm and a copper foil thickness of 35 $\mu$m to form an interlayer circuit board. Then the circuit surface of the interlayer circuit board was roughened by treating at 95° C. for 2 minutes with an alkali solution consisting 31 g/l of sodium chlorite 15 g/l of sodium hydroxide, and 12 g/l of sodium phosphate. Said epoxy resin undercoating agent was applied to the one side of the roughened surface by a screen printing method, dried at 140° C. for 10 minutes in a dryer to be in a tack-free state. Then, the undercoating agent was applied to the back side and dried according to the same procedures as in the one side.

In a separate vessel, 3 parts by weight of 1-orthotolylbiguanide, 4 parts by weight of diethyl dimethyl diamino diphenylmethane, and as a curing accelerator 0.3 part by weight of 2-phenyl-4-methylimidazole were dissolved in 50 parts by weight of dimethylformamide. To the mixture, 85 parts by weight of bisphenol A type epoxy resin (epoxy equivalent: 500) and 15 parts by weight of phenolnovolak epoxy resin were added. This epoxy resin compound was impregnated in a glass cloth having a thickness of 100 $\mu$m and dried with heating at 150° C. for 5 minutes to form a prepreg. Gel time measured of a resin component of the prepreg was 65 seconds at 170° C.

One sheet of the prepreg was laid on each of both sides of the undercoating agent-applied interlayer circuit board, and one sheet of copper foil having a thickness of 18 $\mu$m was further laid on each of both sides. The assembly was heated under the conditions of 180° C. and 60 kg/cm$^2$ with a hot press so that an internal temperature of the laminates be kept at 160° C. or more for 20 minutes and cooled to form a multilayer printed circuit board. Interval time between the initiation of heating and the initiation of cooling was 40 minutes.

Example 2

Into a solution of 80 parts by weight of ethyldiglycol, 10 parts by weight of butylcellosolve acetate and 10 parts by weight of diacetone alcohol, 100 parts by weight of bisphenol A type epoxy resin (epoxy equivalent: 900) was dissolved and 2 parts by weight of fine powder dicyandiamide, 2 parts by weight of a micro-capsulated 2-methylimidazole, and 10 parts by weight ultrafine particulate silica (average particle size of 16 nm, R-972 commercially available from Nippon Aerosil CO., LTD.) were added. The mixture was kneaded by a three-roll mill to form a thermosetting epoxy resin undercoating agent.

Next, an interlayer circuit board was formed according to the same procedures as in Example 1 and the epoxy resin undercoating agent was applied to one side of the interlayer circuit board by a screen printing method, dried at 140° C. for 10 minutes in a dryer to be in a tack-free state. Then, the undercoating agent was applied to the back side and dried according to the same procedures as in the one side.

A prepreg was obtained according to the same procedures as in Example 1. One sheet of the prepreg was laid on each of both sides of said undercoating agent-applied interlayer circuit board, and one sheet of copper foil having a thickness of 18 $\mu$m was further laid on each of both sides. The assembly was heated under the conditions of 180° C. and 60 kg/cm$^2$ with a hot press so that an internal temperature of the laminates be kept at 160° C. or more for 20 minutes and cooled to form a multilayer printed circuit board. Interval time between the initiation of heating and the initiation of cooling was 40 minutes.

Example 3

Into a solution of 80 parts by weight of ethyldiglycol, 10 parts by weight of butylcellosolve acetate and 10 parts by weight of diacetone alcohol, 80 parts by weight of bisphenol A type epoxy resin (epoxy equivalent: 190) was dissolved and 30 parts by weight of Novacure HX-3613 (bisphenol A type epoxy resin (epoxy equivalent: 190), fine powder dicyandiamide, and a micro-capsulated 2-methylimidazole are compounded in the weight ratio of 6:1:2), and 10 parts by weight ultrafine particulate silica (average particle size of 16 nm, R-972 commercially available from Nippon Aerosil CO., LTD.) and 10 parts by weight of talc as a plate filler were added. The mixture was kneaded by a three-roll mill to form a thermosetting epoxy resin undercoating agent.

Next, an interlayer circuit board was formed according to the same procedures as in Example 1 and the epoxy resin undercoating agent was applied to one side of the interlayer circuit board by a screen printing method, dried at 140° C. for 10 minutes in a dryer to be in a tack-free state. Then, the undercoating agent was applied to the back side and dried according to the same procedures as in the one side.

A prepreg was obtained according to the same procedures as in Example 1. One sheet of the prepreg was laid on each of both sides of said undercoating agent-applied interlayer circuit board, and one sheet of copper foil having a thickness of 18 $\mu$m was further laid on each of both sides. The assembly was heated under the conditions of 180° C. and 60 kg/cm$^2$ with a hot press so that an internal temperature of the laminates be kept at 160° C. or more for 20 minutes and cooled to form a multilayer printed circuit board. Interval time between the initiation of heating and the initiation of cooling was 40 minutes.

Comparative Example 1

Into 100 parts by weight of dimethylformamide, 100 parts by weight of bisphenol A type epoxy resin (epoxy equivalent: 190) was dissolved and 8 parts by weight of fine powder dicyandiamide, 2 parts by weight of 2-ethyl-4-methylimidazole, and 10 parts by weight ultrafine particulate silica (average particle size of 16 nm, R-972 commercially available from Nippon Aerosil CO., LTD.) were added. The mixture was kneaded by a three-roll mill to form a thermosetting epoxy resin undercoating agent.

Next, an interlayer circuit board was formed according to the same procedures as in Example 1 and the epoxy resin undercoating agent was applied to one side of the interlayer circuit board by a screen printing method, dried at 140° C. for 10 minutes in a dryer to be in a tack-free state. Then, the undercoating agent was applied to the back side and dried according to the same procedures as in the one side.

A prepreg was obtained according to the same procedures as in Example 1. One sheet of the prepreg was laid on each of both sides of said undercoating agent-applied interlayer circuit board, and one sheet of copper foil having a thickness of 18 $\mu$m was further laid on each of both sides. The assembly was heated under the conditions of 180° C. and 60 kg/cm$^2$ with a hot press so that an internal temperature of the laminates be kept at 160° C. or more for 20 minutes and cooled to form a multilayer printed circuit board. Interval time between the initiation of heating and the initiation of cooling was 40 minutes.

Comparative Example 2

An interlayer circuit board was formed according to the same procedures as in Example 1. A prepreg was obtained according to the same procedures as in Example 1. One sheet of the prepreg was laid on each of both sides of the interlayer circuit board, on which an undercoating agent was not applied, and one sheet of copper foil having a thickness of 18 $\mu$m was further laid on each of both sides. The assembly was heated under the conditions of 180° C. and 60 kg/cm$^2$ with a hot press so that an internal temperature of the laminates be kept at 160° C. or more for 20 minutes and cooled to form a multilayer printed circuit board. Interval time between the initiation of heating and the initiation of cooling was 40 minutes.

Each multilayer printed circuit board obtained as above has properties shown in Table 1.

TABLE 1

|  | Example 1 | Example 2 | Example 3 | Comparative Example 1 | Comparative Example 2 |
|---|---|---|---|---|---|
| Void | None | None | None | None | Observed |
| Solder heat resistance under moisture absorption | ◯ | ◯ | ◯ | ◯ | X |
| Tack-free property | ◯ | ◯ | ◯ | X | — |
| Shelf left of an undercoating agent | ◯ | ◯ | ◯ | X | — |

Measuring methods
1. Void
Surface copper foil is removed by etching and the surface are visually observed.
2. Solder heat resistance under moisture absorption Moisture absorption conditions:

The multilayer printed circuit board was subjected to a PCT treatment at 125° C. for 30 minutes (pressure cooker test: saturated steam treatment under heating).

Test Conditions:

All of the test pieces (n=5) were dipped in a 260° C. solder bath for 20 seconds and visually checked for the presence or absence of blister. o represents no blister. In Comparative Example 2, blister was present in all test pieces.
3. Tack-free property
o represents tack-free feeling when touched, and X represents tacky feeling when touched.
4. Shelf life of an undercoating agent
The undercoating agent was stocked at 20° C. for 30 days. o represents that a viscosity of the agent after stocking is two times or less of a viscosity before stocking, and X represents that a viscosity after stocking is more than two times that of a viscosity before stocking.

As described above, the present process for producing a multilayer printed circuit board comprises the step of beforehand applying a thermosetting epoxy resin undercoating agent to an interlayer circuit board and drying with heating to be in a tack-free state or B-stage. Therefore, no air cells are present in recessions of the circuits of the interlayer circuit board and no voids are left, thereby to obtain a good products (multilayer printed circuit board) even though conventional press molding for a long period of time with a vacuum press are not conducted. Additionally, the molding time can be further shortened by the use of a quick-curing prepreg.

Further, since it comes to be possible to shorten the curing time of the thermosetting resin in the prepreg and the epoxy resin undercoating agent, the multilayer printed circuit board production time can be remarkably shortened.

Furthermore, since the undercoating agent is beforehand applied to the interlayer circuit board in the present invention, the thickness precision of the multilayer printed circuit board can be controlled without being dependent on the copper foil retention ratio in the interlayer circuit board which results in a reduction of the kind of prepreg used. As a result, the prepreg comes to be produced in large amounts and reduced kinds, which results in remarkable reduction of production cost.

What is claimed is:

1. A multilayer printed circuit board comprising an interlayer circuit board laminated to a prepreg,
    wherein the prepreg is obtained by impregnating base material with a thermosetting resin, and
    the multilayer printed circuit board is obtained by applying a thermosetting epoxy resin undercoating agent comprising dicyandiamide and a micro-encapsulated imidazole compound to at least one side of an interlayer circuit board on at least one side of which a circuit has been formed, heating the applied undercoating agent to dry or semi-cure the undercoating agent, and laying the prepreg on said at least one side of the dried or semi-cured undercoating agent-applied interlayer circuit board and subjecting them to laminating.

2. The multilayer printed circuit board according to claim 1, wherein the undercoating agent contains an ultrafine particulate silica, a plate filler, or a mixture thereof.

3. The multilayer printed circuit board according to claim 1, wherein the undercoating agent contains as a solvent at least one component selected from the group consisting of methyldiglycol, ethyldiglycol, butyldiglycol, butylcellosolve acetate and diacetone alcohol.

4. A process for using a multilayer printed circuit board, comprising the step of applying the multilayer printed circuit board according to claim 1, to cameras, facsimiles, duplicating machines, word processors or computers.

5. In a process for making a camera, a facsimile machine, a duplicating machine, a word processor, or a computer, comprising incorporating a printed circuit board, the improvement wherein said printed circuit board is a multi-layered printed circuit board according to claim 2.

6. In a process for making a camera, a facsimile machine, a duplicating machine, a word processor, or a computer, comprising incorporating a printed circuit board, the improvement wherein said printed circuit board is a multi-layered printed circuit board according to claim 3.

7. The multilayer printed circuit board according to claim 2, wherein the undercoating agent contains as a solvent at least one component selected from the group consisting of methyldiglycol, ethyldiglycol, butyldiglycol, butylcellosolve acetate and diacetone alcohol.

8. The multilayer printed circuit board according to claim 1, wherein said circuit comprises a copper layer and said undercoating agent covers said copper circuit.

9. The multilayer printed circuit board according to claim 8 wherein said undercoating agent is applied to both sides of said interlayer circuit board and a said prepreg is laminated to said interlayer circuit board over both sides of said interlayer circuit board coated with said undercoating agent.

10. The multilayer printed circuit board according to claim 1, wherein said undercoating agent consists essentially of said thermosetting epoxy resin, said dicyandiamide, said micro-encapsulated imidazole compound, optionally a solvent, and optionally a filler; said encapsulated imidazole compound has an average particle size of about 1–10 $\mu$m; the weight ratio of said dicyandiamide, said encapsulated imidazole compound and said epoxy resin is 1–10:1–10:100; and the thickness of application of said undercoating agent is in the range of approximately 10–50 $\mu$m.

11. The multilayer printed circuit board according to claim 1, wherein said microencapsulated imidazole compound comprises fine particles of a solid imidazole or a solid blend of resin with liquid imidazole, said fine particles being individually coated with a polyisocyanate resin.

* * * * *